(12) United States Patent
Hanke et al.

(10) Patent No.: US 7,220,666 B2
(45) Date of Patent: May 22, 2007

(54) INTERCONNECTION ELEMENT FOR BGA HOUSINGS AND METHOD FOR PRODUCING THE SAME

(75) Inventors: André Hanke, Strausberg (DE); Stephan Dobritz, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/944,684

(22) Filed: Sep. 17, 2004

(65) Prior Publication Data

US 2005/0093148 A1    May 5, 2005

(30) Foreign Application Priority Data

Sep. 17, 2003   (DE) .................... 103 43 255

(51) Int. Cl.
*H01L 21/4763*   (2006.01)
(52) U.S. Cl. ...................... 438/637; 438/629
(58) Field of Classification Search ........ 438/637, 438/629, 639, 672, 675; 257/774
See application file for complete search history.

(56) References Cited

U.S. PATENT DOCUMENTS

| | | | |
|---|---|---|---|
| 4,468,615 A | | 8/1984 | Jamet et al. |
| 4,554,505 A | | 11/1985 | Zachry |
| 5,665,650 A | * | 9/1997 | Lauffer et al. ............. 216/20 |
| 5,808,474 A | | 9/1998 | Hively et al. |
| 6,080,668 A | * | 6/2000 | Lauffer et al. ............. 438/666 |
| 6,321,443 B1 | | 11/2001 | Barte et al. |
| 6,330,744 B1 | | 12/2001 | Doherty et al. |
| 6,416,332 B1 | | 7/2002 | Carron et al. |
| 6,428,327 B1 | | 8/2002 | Tamarkin et al. |
| 6,468,098 B1 | | 10/2002 | Eldridge |
| 6,541,872 B1 | | 4/2003 | Schrock et al. |
| 2001/0020071 A1 | * | 9/2001 | Capote et al. ............. 525/524 |
| 2002/0042639 A1 | | 4/2002 | Murphy-Chutorian et al. |
| 2002/0121911 A1 | | 9/2002 | Yang et al. |
| 2003/0006790 A1 | | 1/2003 | Holcombe |
| 2004/0038496 A1 | | 2/2004 | Lee et al. |
| 2004/0170795 A1 | * | 9/2004 | Hass et al. ............. 428/41.8 |

FOREIGN PATENT DOCUMENTS

| | | |
|---|---|---|
| DE | 198 33 131 A1 | 4/2000 |
| EP | 0 996 154 A1 | 4/2000 |
| JP | 07-106491 | 4/1995 |
| JP | 2001-015227 | 1/2001 |
| JP | 2002-151627 | 5/2002 |
| WO | WO 97/00598 | 1/1997 |
| WO | WO 02/09194 A1 | 1/2002 |

\* cited by examiner

*Primary Examiner*—Matthew S. Smith
(74) *Attorney, Agent, or Firm*—Slater & Matsil, L.L.P.

(57) ABSTRACT

An electronic component includes an interposer substrate and at least one semiconductor chip mounted on the interposer substrate. A plurality of electrical connections electrically couple a rewiring of the interposer substrate to contact regions of the at least one semiconductor chip. A plurality of connection elements are positioned for electrical contact-connection with a printed circuit board. The interconnection elements comprise hollow-cylindrical or rod-shaped elements that penetrate through and are fixedly connected to the interposer substrate.

20 Claims, 2 Drawing Sheets

INTERCONNECTION ELEMENT FOR BGA HOUSINGS AND METHOD FOR PRODUCING THE SAME

This application claims priority to German Patent Application 103 43 255.8, which was filed Sep. 17, 2003 and is incorporated herein by reference.

TECHNICAL FIELD

The invention relates to an interconnection element for BGA housings and comparable housings having an interposer substrate.

BACKGROUND

In accordance with the customary prior art for FPBGA housings (FPBGA: Fine Pitch Ball Grid Array), caBGA housings (caBGA: Chip Array Ball Grid Array) or TFBGA housings (TFBGA: Thin Fine Pitch Ball Grid Array Package), the packages are provided with an interposer substrate, for example made of a bismaleimide triazine resin. The BGA housings are characterized by the fact that component terminals are applied on their underside area in the form of solder balls.

The solder balls are applied by means of a so-called ball placement. During this method, the solder balls are introduced into a flux in the envisaged contact locations in the form of a ball grid array situated on the interposer. In its conventional form, this ball placement is very complicated and very demanding in terms of process engineering.

The conventional ball placement for an FPBGA package construction is characterized by the fact that firstly a water-soluble, rosin-containing flux is applied to the interposer substrate. This flux has the task of breaking up the oxide layers on the conductive tracks on the interposer substrate and on the solder balls and of making the surfaces wettable. The solder balls placed into the flux are subsequently held at the introduction location by adhesion forces.

In the subsequent reflow soldering process in a soldering furnace, the solder balls are then fused onto the interposer substrate in a multizone cycle at temperatures of 110° C. to 225° C. In this case, the soldering temperature is dependent on the solder materials used.

In order that the flux residues are removed again after the fusing operation, the interposer is subsequently cleaned, preferably by means of spray washing.

The solder balls mounted on the interposer in this way then have to take up in part considerable shear forces after the mounting of the BGA assembly on a printed circuit board, which arise as a result of the thermally governed different coefficients of expansion of the materials involved.

DE 198 33 131 A1 describes a method for the contact-connection of electronic components on flexible substrates, in which semiconductor chips provided with FBGA contact terminals are pressed in a force-locking or positively-locking manner onto the flexible substrate provided with a corresponding contact structure. Utilizing the elasticity of the flexible substrate for contact production ensures that a reliable contact-connection is affected even when the microballs have small size deviations.

What is disadvantageous in this case is that, on the one hand, the placement of the semiconductor chips has to be effected with high accuracy for lack of floating effects and that, on the other hand, quite large-area contacts with elevated contact resistance arise.

Finally, WO 97/00598 (U.S. Pat. No. 6,321,443) describes a connection substrate comprising a dielectric, in the case of which areal connection structures are provided on both sides. Metallized vias as the connection elements are connected to one another. However, this connection element is not suitable for the contact-connection of BGA housings.

SUMMARY OF THE INVENTION

In one aspect, the invention provides an interconnect element for BGA housings that can be produced cost-effectively and can take up thermally governed forces (shear forces) without any problems, and also of specifying a method for producing the same.

In the preferred embodiment, the interconnection element comprises the interposer substrate and a multiplicity of connection elements which are formed in hollow-cylindrical or rod-shaped fashion and are fixedly connected to the interposer substrate, in a manner penetrating through the latter, and also the rewiring.

The interconnection element according to embodiments of the invention can be produced simply, on the one hand, and, on the other hand, enables a substantially simplified mounting technology compared with the solder balls used heretofore. Thus, the interposer substrate not only functions for receiving the rewiring and as a chip-carrying element, but also serves for forming and receiving the new hollow-cylindrical or pin-shaped connection elements that completely replace the solder balls used heretofore.

A further advantage of embodiments of the invention is to be seen in the fact that it is possible to completely prefabricate the interposer substrate with the rewiring and the connection elements embedded in it.

In order that the FBGA package completed by means of chip mounting, wire bonding and molding can be mounted on a printed circuit board, a development of the invention provides for the connection elements to at least partly project from the surface of the interposer substrate. The connection elements may comprise copper or gold and have a diameter of approximately 25 µm.

For the case where the connection elements comprise copper, it is advantageous if they have a surface refinement, e.g., made of nickel and/or gold.

In another aspect, the invention provides a method, which is characterized by the fact that firstly microvias formed in the pitch of ball grid array contact terminals are introduced into an interposer substrate. An electrically conductive material is subsequently introduced into the microvias in a manner forming the connection elements. At the same time, an electrical connection to rewiring of the interposer substrate being produced. A part of the material of the interposer substrate is then removed areally, so that the connection elements protrude from the surface of the interposer substrate.

A further advantage of embodiments of the invention is to be seen in the fact that the electrical connection between the rewiring and the connection elements can be produced in a manner completely free of solder, in contrast to the conventional FBGA technology. At the same time, this also results in a gain in reliability.

In this case, the areal removal (thinning) of the material of the interposer substrate may be effected before or after the chip mounting/molding. It is particularly advantageous if the thinning of the interposer substrate is performed after the chip bonding or before the mounting of the FBGA package on a printed circuit board, because damage to the connection elements during the handling of the package is then virtually precluded.

A development of the invention provides for the microvias to be completely filled with an electrically conductive material, in a manner forming the connection elements.

In a variant of the invention, only the walls of the microvias are coated with an electrically conductive material, in a manner forming hollow-cylindrical connection elements.

This variant of the invention results in a significantly higher thermal/mechanical stability than in the case of conventional solder ball connections.

The coating of the walls of the vias may be performed by means of electrolytic direct metalization.

In a further method step the connection elements may be provided with a surface refinement by means of nickel and/or gold application.

Finally, the microvias may be produced in a simple manner by means of plasma etching through a mask situated on the interposer substrate.

A further possibility for producing the microvias consists in the fact that the latter are introduced into the interposer substrate by mechanical processing, e.g., by stamping.

BRIEF DESCRIPTION OF THE DRAWINGS

The invention is explained in more detail below using an exemplary embodiment. In the associated drawings.

LIST OF REFERENCE SYMBOLS

Figure 1:
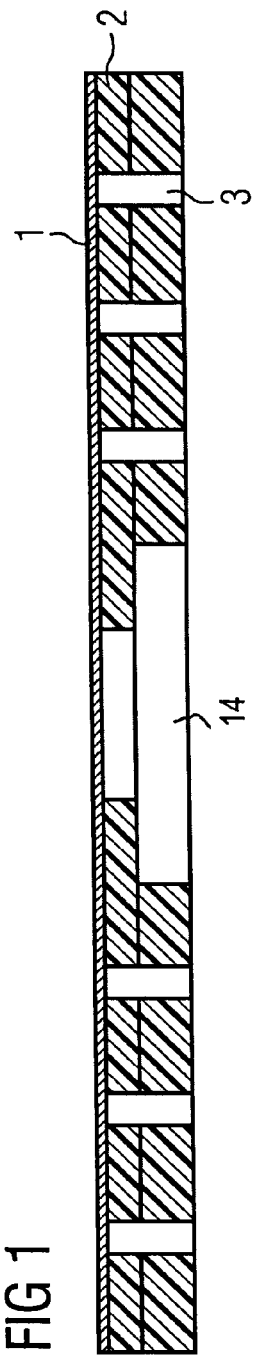
FIG. 1 shows an interposer substrate provided with microvias.

1 Rewiring
2 Interposer substrate
3 Microvia
4 Interconnection element
5 Connection element
6 Chip
7 Tape
8 Wire bridge
9 Potting composition
10 Molding cap
11 FBGA module
12 Printed circuit board
13 Soldering connection
14 Bond channel

DETAILED DESCRIPTION OF ILLUSTRATIVE EMBODIMENTS

FIG. 1 firstly shows an interposer substrate 2 provided with a rewiring 1. In FIG. 1, the rewiring 1 is shown as extending across the entire bottom surface of the substrate 2. This view is schematic in nature and it is understood that rewiring 1 can be patterned on the bottom surface, top surface or within the substrate 2. The substrate 2 has been provided with microvias 3 (holes) with the aid of plasma etching through an etching mask (not illustrated) applied beforehand by means of known photolithography. The microvias 3, as well as bond channel 14, are shown as clear rectangles to indicate that these are recesses formed in the substrate 2.

Figure 2:
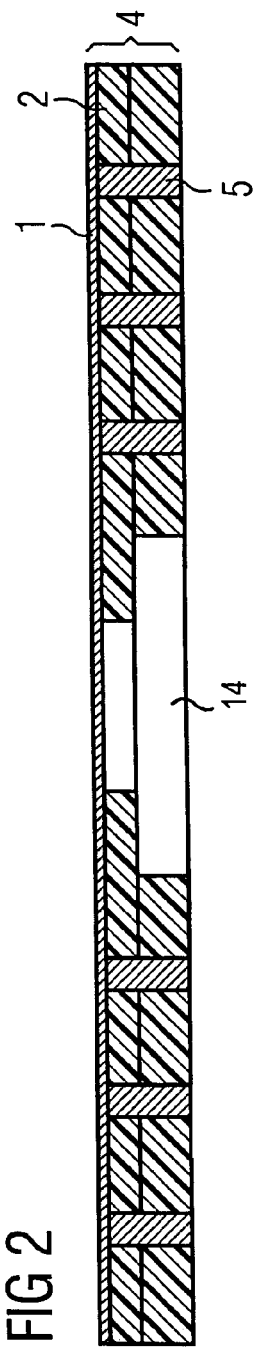
FIG. 2 shows the interconnection element according to the invention, comprising the interposer substrate according to FIG. 1, in the case of which the microvias are filled with a conductive material.

In order to configure the interposer substrate 2 to form an interconnection element 4 according to embodiments of the invention, during the production of the interposer substrate 2, the microvias 3, which have been introduced in a manner formed in the pitch of a ball grid array of a BGA housing by means of plasma etching or mechanical processing, are filled with an electrically conductive material, as shown in FIG. 2. In one embodiment, the diameter of the microvias 3 is approximately 25 µm. The filling with the electrically conductive material results in connection elements 5 that are electrically and mechanically connected to the rewiring 1.

Figure 3:
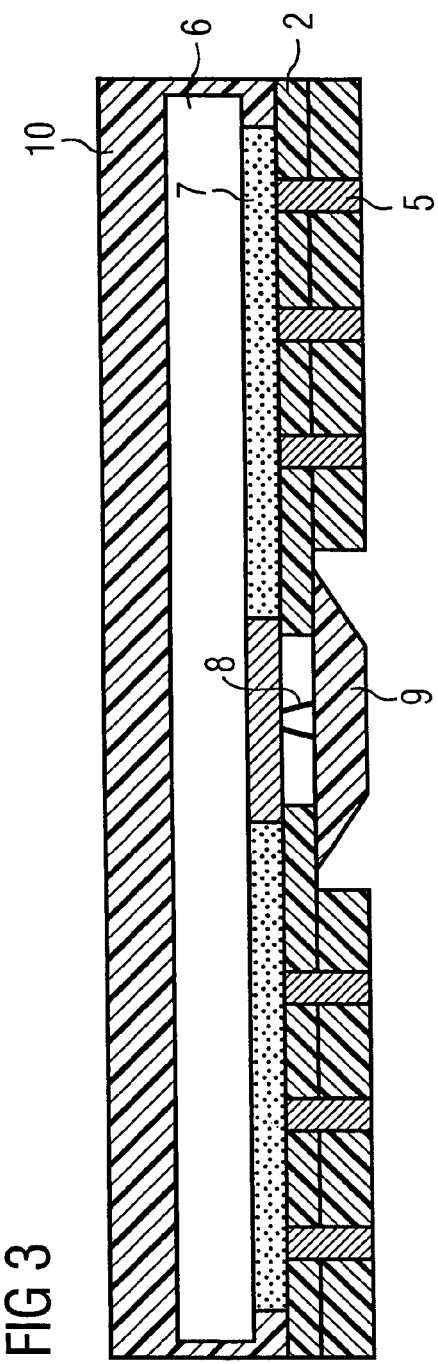
FIG. 3 shows an FBGA package equipped with the interconnection element according to the invention.

Referring now to FIG. 3, a chip 6 can now be mounted onto the now completed interconnection element 4 by means of chip bonding, for example with the interposition of a tape 7. The chip 6 is electrically connected to the rewiring 1 of the interposer substrate 2 by means of wire bridges 8 using the customary wire bonding technology. For the sake of simplicity, the actual connections are not shown. Finally, the FBGA component can then be completed by closing off the bonding channel with a potting composition 9 and subsequently molding with a molding cap 10. The potting composition 9 can be situated to cover the wire bridges 8 regardless of which surface of the substrate 2 they are bonded to. The rewiring 1 is not shown in FIG. 3, but it is understood that it will remain as necessary to form the proper electrical connections.

Figure 4:
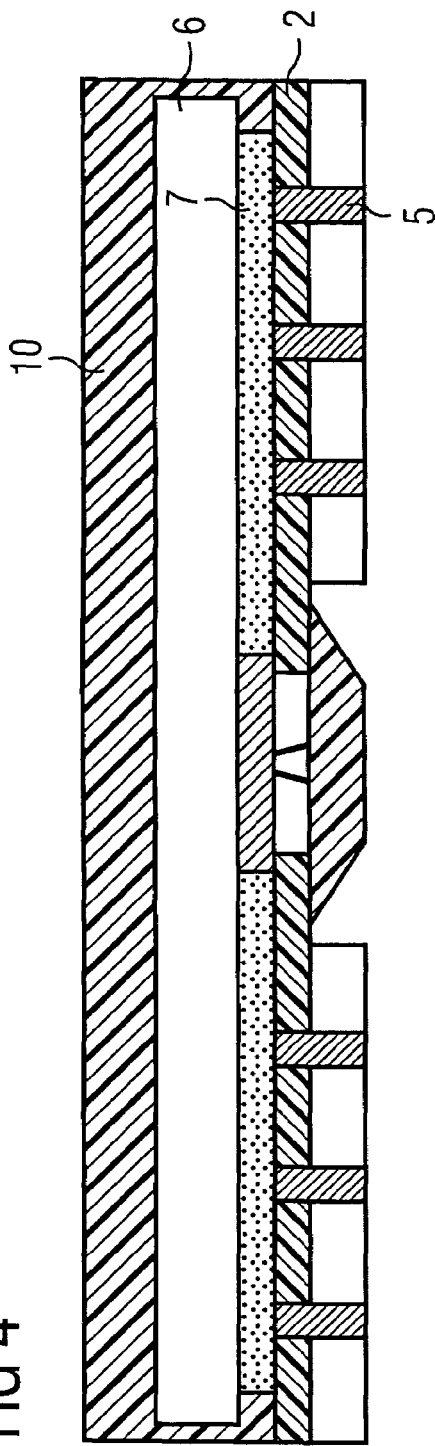
FIG. 4 shows the FBGA package according to FIG. 3, in the case of which the interposer substrate is areally thinned, so that the interconnection elements project from the surface of the interposer substrate.

In a further etching operation, preferably a plasma etching operation, which may be effected before or after the chip mounting/contact connection, a part of the material of the interposer substrate 2 is areally removed, so that the connection elements 5 project from the surface of the interposer substrate 2 in a matrix-type terminal grid, as shown in FIG. 4. Preferably, a uniform thickness of substrate material is removed from the surface of substrate 2. In one embodiment, the potting composition 9 protects the portions of substrate 2 adjacent the wire bridges 8.

In order to achieve a high contact stability of the connection elements 5, it is expedient to perform a surface refinement thereof. This may be affected, for example, by means of a nickel/gold coating.

In a particular refinement of the invention, the filling of the microvias 3 is dispensed with and the latter are metalized only on the hole walls. This may be affected by means of an electrolytic direct metalization.

In this way, the connection elements 5 can be configured as hollow cylinders, which leads to a significantly higher thermal/mechanical stability than when using solder balls.

Figure 5:
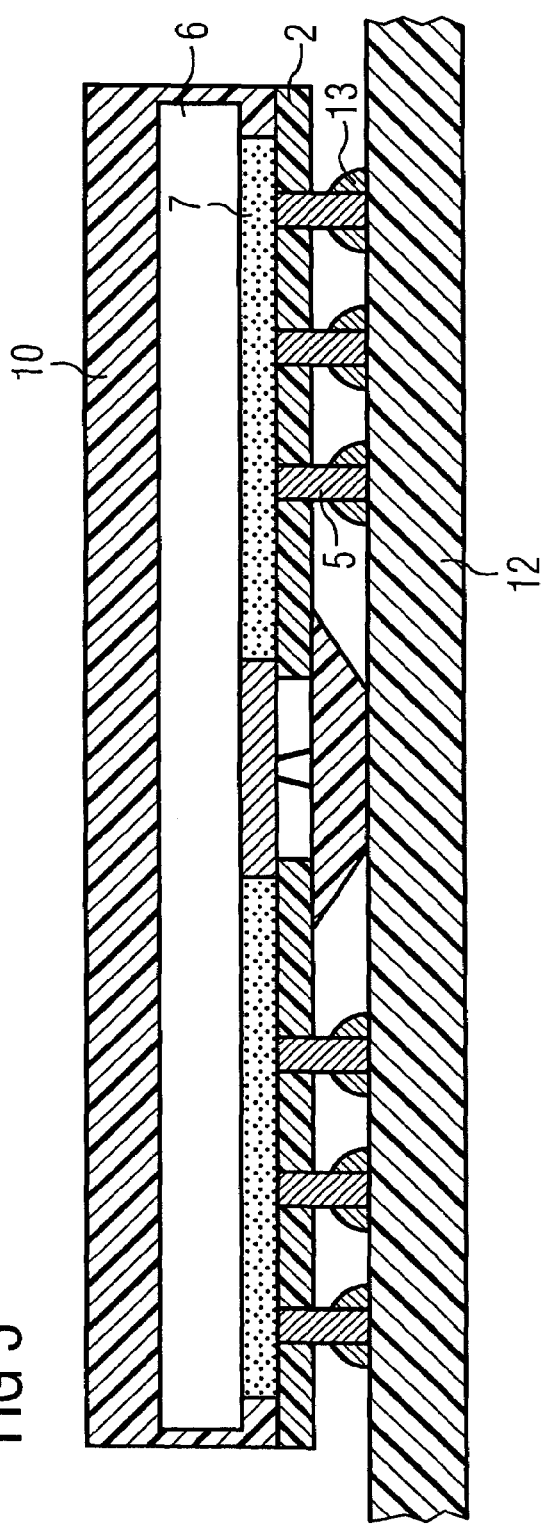
FIG. 5 shows the FBGA package after mounting on a printed circuit board.

FIG. 5 shows an FBGA module 11 equipped with an interconnection element 5 according to the invention after the module has been mounted on a conventional printed circuit board 12 by means of soldering. In this case, the connection elements 5 of the interconnection element 4 are electrically and mechanically connected to the contact islands of the conductive tracks of the printed circuit board 12 by means of soldering connections 13.

The invention revolutionizes the mounting technology of BGA modules because the solder balls (microballs) used heretofore have thus become completely superfluous and have been replaced by connection elements 4 in the form of contact pins or hollow cylinders, which can be produced particularly simply.

In particular, the hollow-cylindrical connection elements 4 guarantee a substantially better electrical connection and durability compared with the solder balls used heretofore. Moreover, the complicated step of ball placement, i.e., the fixing of the solder balls on the interposer substrate 2, is obviated.

The term FBGA module or the like used hitherto in the description correspond to the previous practice for the designation of modules in which solder balls (microballs) are used for the electrical contact-connection. The invention renders the solder balls superfluous and replaces them by pins or hollow cylinders, so that the designations used hitherto for such modules are no longer completely accurate.

What is claimed is:

1. A method for producing an electronic component, the method comprising:
    providing an interposer substrate that includes at least one rewiring layer;
    introducing vias into the interposer substrate, the vias being formed in a pitch of ball grid array contact terminals;
    introducing an electrically conductive material into the vias in a manner forming connection elements and, at the same time, forming an electrical connection between the electrically conductive material and the at least one rewiring layer of the interposer substrate; and
    removing areally a part of material of the interposer substrate so that the connection elements protrude from a surface of the interposer substrate.

2. The method as claimed in claim 1, wherein introducing an electrically conductive material into the vias comprises completely filling the vias with the electrically conductive material.

3. The method as claimed in claim 1, wherein introducing an electrically conductive material into the vias comprises coating the walls of the vias with an electrically conductive material.

4. The method as claimed in claim 3, wherein the coating of the connection elements is effected by means of electrolytic direct metalization.

5. The method as claimed in claim 1, and further comprising refining surfaces of the connection elements.

6. The method as claimed in claim 5, wherein refining surfaces comprises applying nickel and/or gold.

7. The method as claimed in claim 1, wherein introducing vias comprises plasma etching through a mask situated over the interposer substrate.

8. The method as claimed in claim 1, wherein introducing the vias comprises introducing vias into the interposer substrate by mechanical processing.

9. The method as claimed in claim 8, wherein the vias are introduced by stamping.

10. A method of forming an electronic component, the method comprising:
    providing an interposer substrate, the substrate including a plurality of connection elements positioned for electrical contact-connection with a printed circuit board, wherein the interconnection elements comprise hollow-cylindrical or rod-shaped elements that penetrate through and are fixedly connected to the interposer wherein the connection elements at least partly project from the surface of the interposer substrate;
    mounting at least one semiconductor chip on the interposer substrate; and
    electrically coupling a plurality of electrical connections between a rewiring of the interposer substrate and contact regions of the at least one semiconductor chip.

11. The method as claimed in claim 10, wherein electrically coupling a plurality of electrical connections comprises wire bonding.

12. The method as claimed in claim 10, wherein the connection elements have a diameter of approximately 25 µm.

13. The method as claimed in claim 10, wherein the connection elements have a surface refinement.

14. The method as claimed in claim 13, wherein the surface refinement comprises nickel and/or gold.

15. A method of forming an electronic component, the method comprising:
    providing an interposer substrate formed from a non-conductive material;
    forming a plurality of vias in the non-conductive material of the interposer substrate;
    filling the vias with a conductive material; and
    thinning a first surface of the interposer substrate so that portions of the conductive material protrude from the first surface of the substrate.

16. The method of claim 15, wherein forming a plurality of vias in the interposer substrate comprises forming a plurality of microvias in the interposer substrate.

17. The method of claim 15, further comprising:
    adhering a semiconductor chip to a second surface of the interposer substrate, the second surface being opposed to the first surface; and
    electrically coupling contact areas on the semiconductor chip to contact areas on the interposer substrate, the contact areas on the interposer substrate being electrically coupled to the conductive material filling the vias.

18. The method of claim 17, wherein the thinning step is performed before the adhering step.

19. The method of claim 17, wherein the thinning step is performed after the adhering step.

20. The method of claim 15, wherein thinning comprises removing a uniform thickness of material from the first surface of the substrate.

* * * * *